(12) United States Patent
Duggal et al.

(10) Patent No.: US 6,501,218 B1
(45) Date of Patent: Dec. 31, 2002

(54) OUTDOOR ELECTROLUMINESCENT DISPLAY DEVICES

(75) Inventors: Anil Raj Duggal, Niskayuna, NY (US); Larry Gene Turner, Galway Lake, NY (US)

(73) Assignee: General Electric Company, Niskayuna, NY (US)

( * ) Notice: Subject to any disclaimer, the term of this patent is extended or adjusted under 35 U.S.C. 154(b) by 187 days.

(21) Appl. No.: 09/592,075

(22) Filed: Jun. 12, 2000

(51) Int. Cl.$^7$ .................................................. H01J 1/62
(52) U.S. Cl. ........................................ 313/510; 313/513
(58) Field of Search ................................ 313/504, 506, 313/503, 513, 486, 489, 502, 507, 510

(56) References Cited

U.S. PATENT DOCUMENTS

| | | | | |
|---|---|---|---|---|
| 3,581,137 A | * | 5/1971 | Arnott et al. | 313/109 |
| 4,143,297 A | * | 3/1979 | Fischer | 313/502 |
| 5,247,190 A | | 9/1993 | Friend et al. | 257/40 |
| 5,289,171 A | * | 2/1994 | Nire et al. | 345/76 |
| 5,708,130 A | | 1/1998 | Woo et al. | 528/397 |
| 5,902,688 A | | 5/1999 | Antoniadis et al. | 428/690 |
| 5,909,081 A | * | 6/1999 | Eida et al. | 313/504 |
| 5,962,962 A | | 10/1999 | Fujita et al. | 313/412 |
| 5,982,969 A | * | 11/1999 | Sugiyama et al. | 385/123 |
| 6,054,725 A | * | 4/2000 | Liedenbaum et al. | 257/91 |

OTHER PUBLICATIONS

U.S. Ser. No. 09/469,702, filed Dec. 22, 1999 (RD–27,258).

R. H. Friend, 4 Journal of Molecular Electronics 37–46 (1988).

Junji Kido et al., Organic Electroluminescent Devices Based on Molecularly Doped Polymers, 61 Appl. Phys. Lett. 761–763 (1992).

Gerrit Klarner et al., Colorfast Blue Light Emitting Random Copolymers Derived from Di–n–hexyfluorene and Anthracene, 10 Adv. Mater. 993–997 (1998).

Chung–Chih Wu et al., Efficient Organic Electroluminescent Devices Using Single–Layer Doped Polymer Thin Films with Bipolar Carrier Transport Abilities, 44 IEEE Trans. On Elec. Devices 1269–1281 (1997).

* cited by examiner

*Primary Examiner*—Robert H. Kim
*Assistant Examiner*—Jurie Yun
(74) *Attorney, Agent, or Firm*—Toan P Vo; Noreen C. Johnson

(57) ABSTRACT

A device structure and method for outdoor signs utilizing organic light emitting device (OLED) technology. Exemplary embodiments of the device include an OLED that is patterned into a sign combined with an exterior layer consisting of a highly scattering, non-absorbing coating over the OLED emitting regions and a highly absorbing coating over the non-emitting regions. The result is a sign that can be viewed using organic electroluminescent (EL) light under low ambient light level conditions, and due to the exterior coating, can also be viewed under high ambient light conditions.

42 Claims, 3 Drawing Sheets

OUTDOOR ELECTROLUMINESCENT DISPLAY DEVICES

BACKGROUND OF THE INVENTION

The present invention relates generally to electroluminescent devices. More particularly, the present invention relates to outdoor electroluminescent display devices that are visible under a wide variety of ambient light conditions.

There are numerous applications for signs that can be read under conditions of both low and high ambient light (e.g., at night and in daylight). Road signs are one common example. Typically, these signs are printed so that they provide high contrast under reflected light. In daylight, they are readable due to reflected sunlight, and at night they are visible due to reflected artificial light, such as from the headlights of an automobile or from a dedicated spotlight aimed at the sign. Signs that are visible at night by means of a dedicated spotlight are inefficient from an energy standpoint, because most of the light from the spotlight is wasted in illuminating regions that do not require illumination for sign readability. Signs that rely on lights from automobile headlights from night-time readability have the disadvantage that they are only visible when the car is aiming directly at them. In addition, these signs can be hard to read at night in rainy conditions where much of the light from the car headlights is scattered by the rain droplets.

Cathode ray tube (CRT) technology has been developed to allow customizable signs that can be read in the dark. Such displays can be quickly reconfigured electronically to display a new sign. Other technologies with similar capabilities include liquid crystal displays, thin film plasma displays, and organic electroluminescent displays. However, these displays require complicated electronics and are too expensive for many simple display sign applications.

U.S. Pat. No. 5,962,962 describes a basic organic light emitting device (OLED). The OLED has a structure in which an anode, an organic light emitting layer, and a cathode are consecutively laminated, with the organic light emitting layer sandwiched between the anode and the cathode. Generally, electrical current flowing between the anode and cathode passes through points of the organic light emitting layer and causes it to luminesce. The electrode positioned on the surface through which light is emitted is formed of a transparent or semi-transparent film. The other electrode is formed of a specific thin metal film, which can be a metal or an alloy.

The organic light emitting device is usually formed on a substrate. In some cases, a hole-transporting layer is provided between the anode and the organic light emitting layer, and an electron-injecting layer is provided between the cathode and the organic light emitting layer, for improved performance.

Another example of an OLED is disclosed in U.S. Pat. No. 5,902,688. This patent discloses displays produced by providing an insulator that is patterned in a desired shape. In general, light will be produced in an OLED wherever an anode and cathode have a direct path to a particular point of the OLED. The insulator of this patent is in the form of an incomplete layer between the organic layer and one of the electrodes, and prevents contact of at least one electrode from a pattern of particular points on the OLED, which prevents those points of the organic layer from illuminating. To achieve a particular display, the insulator layer is patterned so as to retard the flow of current through the organic layer in proportion to the areas of the desired display that are to be relatively dark. However, a sign using this display depends only on the contrast between the illuminated and dark areas of the device, and the luminance that is possible with practical OLED devices is relatively low (<10,000 candelas per square meter (Cd/m2)). Because of this, while these displays may be visible during conditions of low light, they cannot be read under bright ambient conditions (e.g., in the midday sun). Further, the process of forming the insulating layer is difficult and time-consuming, which increases the cost of production of such a device.

It would be desirable to provide a cost-effective sign that is readable under low and high ambient light conditions, which does not suffer from the above disadvantages. It would further be desirable to provide a simple method for production of such a sign.

BRIEF SUMMARY OF THE INVENTION

A device structure and method are disclosed that enable the production of outdoor signs utilizing organic light emitting device (OLED) technology. Exemplary embodiments of the device include an OLED that is patterned into a sign combined with an exterior layer comprising (1) a highly scattering, non-absorbing coating over the OLED emitting regions, and (2) a highly absorbing coating over the non-emitting regions. The result is a sign that can be viewed using organic electroluminescent light under low ambient light conditions, and due to the exterior coating, can also be viewed under high ambient light conditions. Thus, embodiments of the present invention provide a degree of contrast, both in natural daylight and at night, which facilitates easy viewing of, for example, a street sign.

BRIEF DESCRIPTION OF THE DRAWINGS

The features and advantages of the present invention can be understood more completely by reading the following detailed description of preferred embodiments in conjunction with the accompanying drawings, in which like reference indicators are used to designate like elements, and in which.

DETAILED DESCRIPTION OF THE INVENTION

Figure 1:
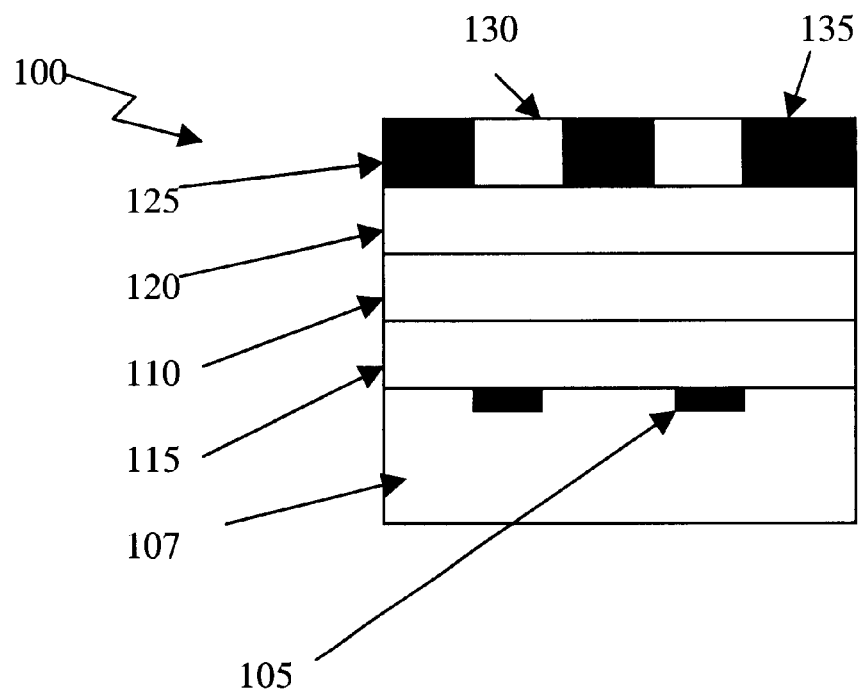
FIG. 1 is a side view of one embodiment of the invention.

A representative embodiment of the present invention includes an OLED display coupled with an adjacent layer comprising regions of a highly scattering, non-absorbing coating, and regions of a highly absorbing coating, in order to provide both good contrast and visibility in light reflected by the display.

By an "organic light emitting device" (OLED) is meant an electroluminescent device comprising two electrodes (an anode and a cathode) as well as an organic light emitting layer, generally sandwiched between the anode and the cathode. When a current passes through the organic light emitting layer, it luminesces.

By an "organic light emitting layer" is meant a layer including at least one organic compound which, when subjected to an electric current, will luminesce. The invention is not limited to any particular organic compound but rather encompasses a broad range of such compounds known in the art.

By a "highly scattering coating" is meant a coating that can be easily viewed in reflected light. The highly scattering coating may comprise particles of a material having a relatively high index of refraction such as $TiO_2$ or $SiO_2$ or ZnO, for example.

Typically, the light scattering particles have an index of refraction greater than 1.4. The highly scattering coating can be absorbing or non-absorbing and has a thickness which is thin enough to substantially transmit the light emitted by the OLED (transmission >20%, preferably >40%). Optionally, the highly scattering coating is fluorescent and/or colored.

By a "highly absorbing coating", is meant one which substantially absorbs the light emitted by an OLED, generally corresponding to an absorption >60%, preferably 90%, most preferably >99%. Optionally additional properties of the highly absorbing coating, which can appear alone or in combination with the properties set forth above, include it being colored, fluorescent, and highly scattering.

According to exemplary embodiments of the invention, the highly scattering coating is placed above the regions of the OLED from which electroluminescent light is desired to be emitted under nighttime conditions, and the highly absorbing coating occupies some or all of the other regions. A simple implementation for the two types of coatings is paint. Acrylic enamel is a preferred paint, but other types of paint may be used. According to one embodiment, the highly scattering coating comprises white paint. Of course, other colors, such as green or red, may be used as the highly scattering coating. Note that the color emitted by the device during nighttime conditions is determined by the emission color of the OLED. The layer of non-absorbing paint is selected to be thick enough to provide good visibility for reflected light in high ambient light conditions, and thin enough to provide good visibility for electroluminescent light in low ambient light conditions.

The highly absorbing coating may comprise black paint, for example, or any other color paint which substantially absorbs the light emitted by an OLED. The highly absorbing coating is preferably thick enough to provide good contrast with the highly scattering coating as reflected light, and to absorb substantially all the OLED generated light such that substantially no OLED generated light is emitted from the region of the highly absorbing coating. The thickness of the highly absorbing coating of course should be sufficient to provide a suitable degree of absorption, typically no less than 60% absorption. Examples of highly absorbing coatings other than paint include opaque materials affixed to the underlying layer, such as an opaque paper, plastic or metal.

Regardless of type, the highly scattering or highly absorbing coatings can be employed in a device where the OLED is overlaid with an additional substrate such as a transparent glass or plastic film, which substrate is coated with the highly scattering and/or highly absorbing coatings. These coatings can be applied by conventional techniques such as spraying, dipping, brushing, lamination or by laser printing.

Generally, the organic light emitting device is provided as a luminescent display which includes an organic light emitting layer disposed between two electrodes. The organic light emitting layer emits light upon application of a voltage across the electrodes. The anode and cathode inject charge carriers, i.e., holes and electrons, into the organic light emitting layer where they recombine to form excited molecules or excitons which emit light when the molecules or excitons decay. The color of light emitted by the molecules depends on the energy difference between the excited state and the ground state of the molecules or excitons. Typically, the applied voltage is about 3–10 volts but can be up to 30 volts or more, and the external quantum efficiency (photons out/electrons in) is between 0.01% and 5%, but could be up to 10%, 20%, 30%, or more. The organic light emitting layer typically has a thickness of about 50–500 nanometers, and the electrodes each typically have a thickness of about 100–1000 nanometers.

The cathode generally comprises a material having a low work function value such that a relatively small voltage causes emission of electrons from the cathode. The cathode may comprise, for example, calcium or a metal such as gold, indium, manganese, tin, lead, aluminum, silver, magnesium, or a magnesium/silver alloy. Alternatively, the cathode can be made of two layers to enhance electron injection. Examples include a thin inner layer of LiF followed by a thicker outer layer of aluminum or silver, or a thin inner layer of calcium followed by a thicker outer layer of aluminum or silver.

The anode typically comprises a material having a high work function value. The anode is preferably transparent so that light generated in the organic light emitting layer can propagate out of the luminescent display. The anode may comprise, for example, indium tin oxide (ITO), tin oxide, nickel, or gold. The electrodes can be formed by conventional vapor deposition techniques, such as evaporation or sputtering, for example.

A variety of organic light emitting layers can be used in conjunction with exemplary embodiments of the invention. According to one embodiment, the organic light emitting layer comprises a single layer. The organic light emitting layer may comprise, for example, a conjugated polymer which is luminescent, a hole-transporting polymer doped with electron transport molecules and a luminescent material, or an inert polymer doped with hole transporting molecules and a luminescent material. The organic light emitting layer may also comprise an amorphous film of luminescent small organic molecules which can be doped with other luminescent molecules.

Alternatively, the organic light emitting layer may comprise two or more sublayers which carry out the functions of hole injection, hole transport, electron injection, electron transport and luminescence. Only the luminescent layer is required for a functioning device. However, the additional sublayers generally increase the efficiency with which holes and electrons recombine to produce light. Thus the organic light emitting layer can comprise 1–4 sublayers including, for example, a hole injection sublayer, a hole transport sublayer, a luminescent sublayer, and an electron injection sublayer. Also, one or more sublayers may comprises a material which achieves two or more functions such as hole injection, hole transport, electron injection, electron transport, and luminescence.

Embodiments in which the organic light emitting layer comprises a single layer will now be described.

According to a first embodiment, the organic light emitting layer comprises a conjugated polymer. The term conjugated polymer refers to a polymer which includes a delocalized pi-electron system along the backbone of the polymer. The delocalized pi-electron system provides semiconducting properties to the polymer and gives it the ability to support positive and negative charge carriers with high mobilities along the polymer chain. The polymer film has a sufficiently low concentration of extrinsic charge carriers than on applying an electric field between the electrodes, charge carriers are injected into the polymer and radiation is emitted from the polymer. Conjugated polymers are discussed, for example, in R. H. Friend, 4 Journal of Molecular Electronics 37–46 (1988).

One example of a conjugated polymer which emits light upon application of a voltage is PPV (poly(p-phenylenevinylene)). PPV emits light in the spectral range of about 500–690 nanometers and has good resistance to thermal and stress induced cracking. A suitable PPV film typically has a thickness of about 100–1000 nanometers. The PPV film can be formed by spin coating a solution of the precursor to PPV in methanol onto a substrate and heating in a vacuum oven.

Various modifications can be made to the PPV while retaining its luminescent properties. For example, the phenylene ring of the PPV can optionally carry one or more substituents each independently selected from alkyl, alkoxy, halogen, or nitro. Other conjugated polymers derived from PPV may also be used in conjunction with exemplary embodiments of the invention. Examples of such derivatives of PPV include: 1) polymers derived by replacing the phenylene ring with a fused ring system, e.g., replacing the phenylene ring with an anthracene or naphthalene ring system. These alternative ring systems may also carry one or more substituents of the type described above with respect to the phenylene ring; 2) polymers derived by replacing the phenylene ring with a heterocyclic ring system such as a furan ring. The furan ring may carry one or more substituents of the type described above in connection with the phenylene ring; 3) polymers derived by increasing the number of vinylene moieties associated with each phenylene or other ring system. The above described derivatives have different energy gaps, which allows flexibility in producing an organic light emitting layer which emits in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. The fluorenes, oligomers and polymers may be substituted at the 9-position with two hydrocarbyl moieties which may optionally contain one or more of sulfur, nitrogen, oxygen, phosphorous or silicon heteroatoms; a $C_{5-20}$ ring structure formed with the 9-carbon on the fluorene ring or a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which may further be substituted with moieties which are capable of crosslinking or chain extension or a trialkylsiloxy moiety. The fluorene polymers and oligomers may be substituted at the 2- and 7'-positions. The monomer units of the fluorene oligomers and polymers are bound to one another at the 2- and 7'-positions. The 2,7'-aryl-9-substituted fluorene oligomers and polymers may be further reacted with one another to form higher molecular weight polymers by causing the optional moieties on the terminal 2,7'-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

Other suitable polyfluorenes which can be used in conjunction with exemplary embodiments of the invention include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT can be prepared by the nickel-mediated copolymerization of the corresponding aryl dibromides. The final polymer molecular weight can be controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993–997 (1998), which is hereby incorporated by reference.

According to a second embodiment of a single layer device, the organic light emitting layer comprises a molecularly doped polymer. A molecularly doped polymer typically comprises a binary solid solution of charge transporting molecules which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methylmethacrylate) (PMMA) molecularly doped with the hole transporting molecule N,N'-diphenyl-N,N'-bis(3-methylsphenyl)-1,1'-biphenyl-4,4'-diamine (TPD) and the luminescent material tris(8-quinolinolato)-aluminum(III) (Alq). TDP has a high hole drift mobility of 10−3 cm2/volt-sec, while Alq is a luminescent metal complex having electron transporting properties in addition to its luminescent properties.

The doping concentration is typically about 50%, while the molar ratio of TDP to Alq may vary from about 0.4 to 1.0, for example. A film of the doped PMMA can be prepared by mixing a dichloroethane solution containing suitable amounts of TPD, Alq, and PMMA, and dip coating the solution onto the desired substrate, e.g., an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers," 61 Appl. Phys. Lett. 761–763 (1992), which is hereby incorporated by reference.

According to another embodiment of the invention, the organic light emitting layer comprises two sublayers. The first sublayer provides hole transport, electron transport, and luminescent properties and is positioned adjacent the cathode. The second sublayer serves as a hole injection sublayer and is positioned adjacent the anode. The first sublayer comprises a hole-transporting polymer doped with electron transporting molecules and a luminescent material, e.g., a dye or a polymer. The hole-transporting polymer may comprise poly(N-vinylcarbazole) (PVK), for example. The electron transport molecules may comprise 2-(4-biphenyl)-5-(4-tert-butylphenyl)-1,3,4-oxadiazole (PBD), for example. The luminescent material typically comprises small molecules or polymers which act as emitting centers to vary the emission color. For example, the luminescent materials may comprises the organic dyes coumarin 460 (blue), coumarin 6 (green), or nile red. The above materials are available commercially, for example from Aldrich Chemical Inc., Lancaster Synthesis Inc., TCI America, and Lambda Physik Inc. Thin films of these blends can be formed by spin coating a chloroform solution containing different amounts of PVK, electron transport molecules, and luminescent materials. For example, a suitable mixture comprises 100 weight percent PVK, 40 weight percent PBD, and 0.2–1.0 weight percent organic dye.

The second sublayer serves as a hole injection sublayer and may comprise poly(3,4)ethylenedioxythiophene/polystyrenesulphonate (PEDT/PSS), for example, available from Bayer Corporation, which can be applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities," 44 IEEE Trans. On Elec. Devices 1269–1281 (1997), which is hereby incorporated by reference.

Figure 2:
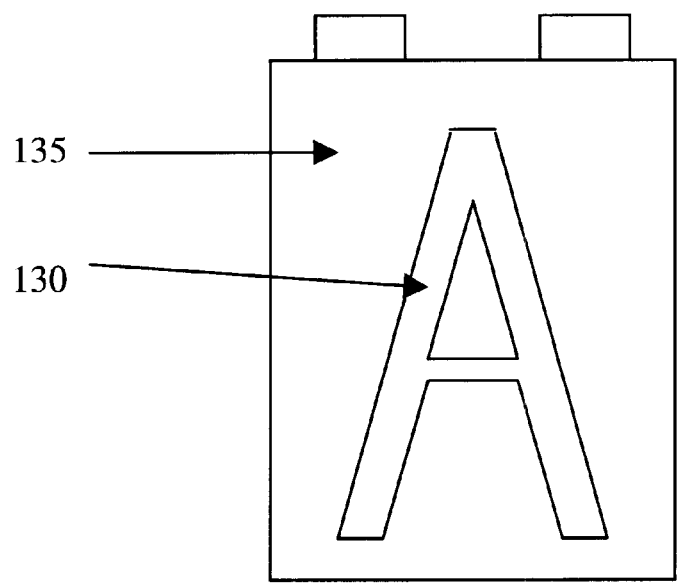
FIG. 2 is a top view of the embodiment in FIG. 1.

FIGS. 1 and 2 depict an OLED device 100 patterned to provide light in the form of the letter "A". A desired sign can, of course, be constructed in a modular manner from a collection of such one-letter or one-symbol signs. FIG. 2 is a top view of the OLED in FIG. 1. The device in FIGS. 1 and 2 comprises a metal cathode 105 and an indium tin oxide (ITO) anode 110. These electrodes 105, 110 are disposed on opposite sides of an organic light emitting layer 115. In this embodiment, the cathode 105 is patterned in the form of the letter "A", but the anode 110 could just as well be patterned, or both electrodes could be patterned. Alternatively, neither electrode could be patterned. A transparent substrate 120 is adjacent to the anode 110. The highly scattering coating 130 is applied to the substrate 120 in a desired pattern, e.g. in the form of the letter "A" corresponding to the patterned cathode 105. The highly absorbing coating 135 is applied to the substrate 120 in the regions not occupied by the highly scattering coating 130. A barrier layer 107 comprising, for example, glass or an inorganic coating such as $Si_3N_4$ or $SiO_2$, can be applied over the cathode 105 for protection from water and oxygen.

There are many other possible embodiments of the invention. For example, the OLED device need not be patterned at all. The highly absorbing and highly scattering coatings can define the pattern on the sign, although light is wasted with this approach. In addition, the highly scattering coating 130 can include pigments that provide color when viewed as reflected light or which fluoresce. Preferably, such pigments do not substantially absorb the light emitted by the OLED under nighttime operation. Alternatively, phosphors can be added to the highly scattering coating that shift the wavelength of light emitted by the OLED. The highly absorbing coating can also be formed by physically attaching opaque substances such as paper, plastic, or metal onto the regions where light is not meant to be emitted. The opaque substances preferably have enough absorption to provide good contrast under reflected light viewing.

One embodiment of the present invention is a sign at a roadway intersection, such as a STOP sign. The exterior of the sign can be painted in the familiar red background and white letters. The interior of the sign can comprise an OLED. During daytime operation, the sign is visible, similar to a conventional street sign, due to the coatings applied to the exterior of the sign. Ambient daylight is sufficient to illuminate the background and letters of the sign. At night, and in conditions of low light, the sign does not depend on reflected artificial light. Rather, the sign is visible due to its internal light source, which illuminates the letters of the sign. Light transmission is attenuated or blocked by the highly absorbing coating. Because the sign does not rely on a dedicated spotlight for nighttime visibility, the sign is much more efficient from an energy usage standpoint. Because the sign does not rely on automobile headlights for readability, it is visible to pedestrians, bicyclists, and others who do not have bright headlights. In addition, the sign is easily visible from a vehicle at night in rainy conditions where much of the light from the car headlights is scattered by the rain droplets.

EXAMPLE 1

Figure 3:
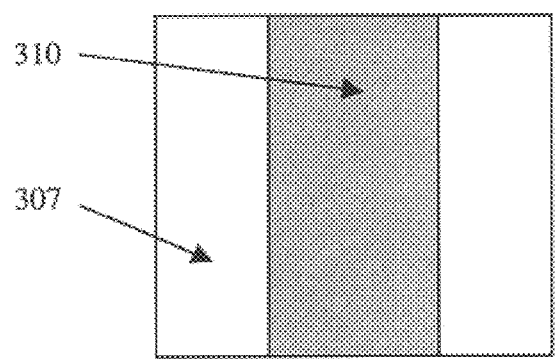
FIG. 3 is a top view of an anode layer applied below an organic light emitting layer of a device according to an embodiment of the invention.
Figure 4:
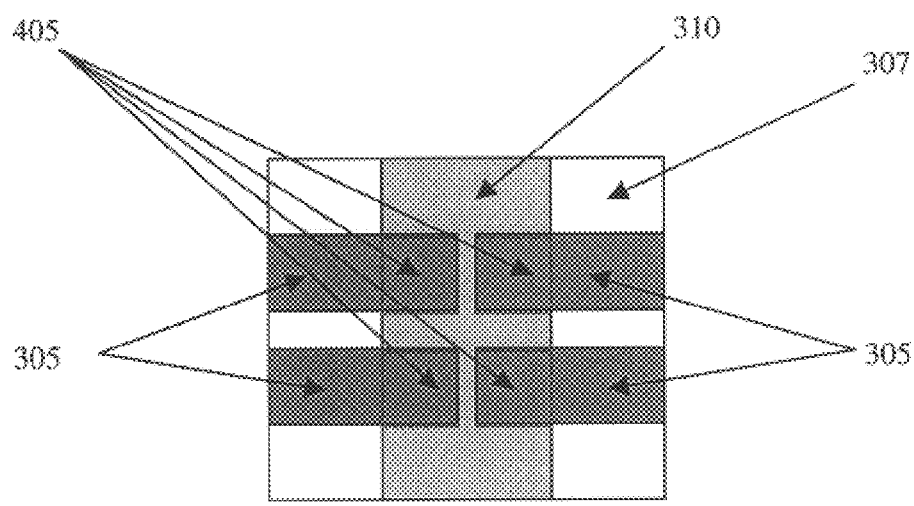
FIG. 4 is a top view of a cathode layer applied over an organic light emitting layer of a device according to an embodiment of the present invention.
Figure 5:
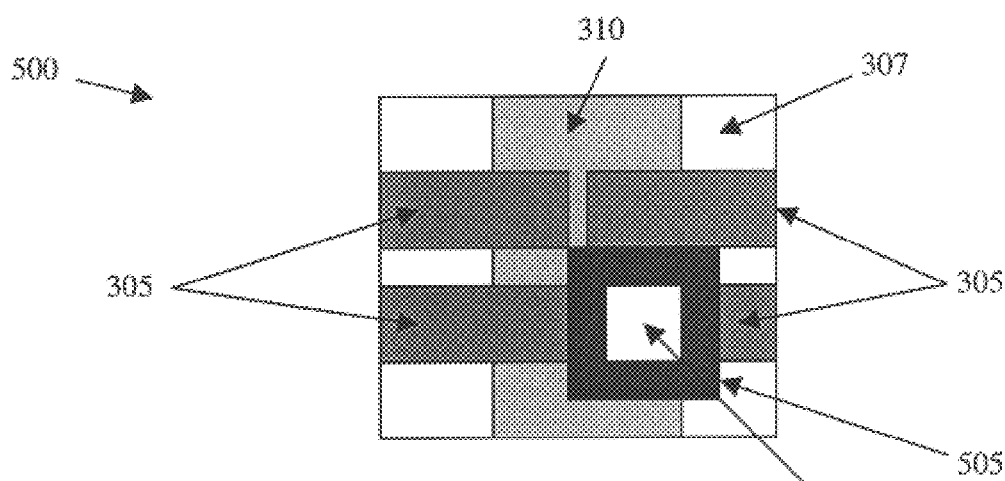
FIG. 5 is a top view of a patterned coating applied over a cathode layer of a device according to an embodiment of the present invention.

FIGS. 3–5 show intermediate steps in the production of a patterned, green-emitting OLED device according to an embodiment of the present invention. An indium tin oxide (ITO) coated glass (15 ohm-square) substrate 307 was obtained from Applied Films Corporation, and portions of the ITO were etched away using the vapors of aqua regia to provide the patterned anode 310 shown in FIG. 3. This combined substrate 307 and anode 310 was then mechanically cleaned with a detergent, soaked in a methanol solution followed by a boiling isopropyl alcohol solution, and finally placed in an ozone cleaner for 5 minutes. An approximately 5 nanometer (nm) layer of poly(3,4)ethylenedioxythiophene/polystyrenesulphonate (PEDT/PSS) (not shown) from Bayer Corporation was then spin coated onto the anode 310. Approximately 100 nm of a polymer blend consisting of poly(9-vinyl carbazole) (PVK) from Aldrich Co., 2-(4-biphenylyl)-5-(4-tert-butyl-phenyl)-1,3,4-oxadiazole (PBD) from Aldrich Co., and coumarin 540 from Exciton Co., with weight percent ratios of 70:30:0.5 was then spin coated onto the PEDT/PSS layer using dichloroethane as the solvent. Next, as shown in FIG. 4, a cathode 305 comprising an approximately 0.8 nm layer of lithium fluoride followed by about 100 nm of aluminum was evaporated onto the device through a shadow mask to define the cathode pattern shown in FIG. 4. The device was then transferred to a glove box, and a glass slide was attached to the cathode side of the device with epoxy to provide encapsulation. The resulting device consisted of four independently addressable organic light emitting devices 405 that each emitted green light in a square pattern, defined by the areas where the cathodes 305 overlap the anode 310.

A sign 500 illustrating the invention, shown in FIG. 5, was then made with this patterned OLED in the following manner. A highly scattering coating 510 comprising a white paint (Acrylic Enamel Industrial Tough Coat from Krylon—a division of Sherwin-Williams Company) was sprayed onto the transparent substrate 307 side of the device above one of the addressable squares. Around the white paint, a highly absorbing coating 505 comprising black paint (Flat Enamel 1149 Black from Testors Co.) was applied by means of a brush. Note that the square 510 comprising the highly scattering coating corresponds to one of the four elements 405 in FIG. 4. Under low ambient light conditions, the sign 500 can be activated by applying a voltage across the electrodes. For this particular device, when a voltage is applied, the square 510 lights up with a green color against a black background. With a voltage of 12 volts (V), a luminance of about 30 Cd/m$^2$ was measured. At this brightness level, the green sign is easily seen in the dark. With a voltage of 20V, a luminance of about 500 Cd/m$^2$ was measured. At this brightness level, the green sign is easily seen in a well-lit indoor environment, or outdoors on an overcast day. In bright daylight, the sign is clearly visible as a white square against a black background due to the coatings applied to the exterior of the sign.

EXAMPLE 2

Figure 6:
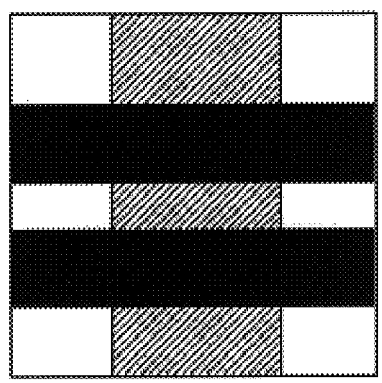
FIG. 6 is a top view of a cathode pattern formed by evaporating a layer of lithium fluoride followed by aluminum onto the device through a shadow mask.

A patterned, red-emitting OLED device was made in the following manner. Indium tin oxide (ITO) coated glass (15 ohm-square) was obtained from Applied Films Corporation, and portions of it were etched away using the vapors of aqua regia to provide the ITO pattern shown in FIG. 3. This substrate was then mechanically cleaned with a detergent, soaked in a methanol solution followed by a boiling isopropyl alcohol solution, and finally placed in an ozone cleaner for 5 minutes. An approximately 20 nm layer of poly(3,4)ethylenedioxythiophene/polystyrenesulphonate (PEDT/PSS) from Bayer Corporation was then spin coated onto the ITO. Approximately 50 nm of a red-emitting polymer (Red-A obtained from Dow Chemical Co.) was then spin coated onto the PEDT/PSS layer using xylene as the solvent. Next, a cathode consisting of an approximately 0.8 nm layer of lithium fluoride followed by about 200 nm of aluminum was evaporated onto the device through a shadow-mask to define the cathode pattern shown in FIG. 6. The cathode deposition was carried out in a glove box. After cathode deposition, a glass slide was attached to the cathode side of the device with epoxy to provide encapsulation. The resulting device consists of 2 independently addressable OLEDs which emit red light in a rectangular pattern.

Figure 7:
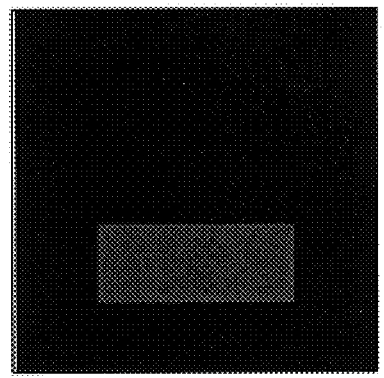
FIG. 7 is a sign in the form of a red rectangle in a black background.

A sign illustrating this invention was then made with this patterned OLED in the following manner. A highly scattering red fluorescent coating (Fluorescent Red #FS28915 available from Model Master) with a similar red color to that of the OLED emission color was sprayed onto a glass slide. The area of the slide covered by the fluorescent red coating was chosen to match the emissive area of one of the OLED devices when the glass slide is overlayed onto the emitting surface of the OLED device. Around this fluorescent red region of the slide, a highly absorbing coating consisting of a black paint (Krylon Industrial tough coat latex enamel #S63725 semi-flat black) was sprayed around the rectangle as illustrated in FIG. 7. The slide was then overlayed onto the emissive side of the OLED device to complete the sign in the form of a rectangle. In bright daylight, the sign is clearly visible as a fluorescent red rectangle against a black background. Under low ambient light conditions, the sign can be activated by applying a voltage across the device. For this particular device, when a voltage is applied, the rectangle lights up with a red color against a black background. With a voltage of 5V, a luminance of about 120 Cd/m$^2$ was measured. At this brightness level, the red sign is easily seen in a well-lit indoor environment or outdoors on an overcast day. For this particular example, the transmission of the red light emitted by the OLED through the fluorescent red coating was measured to be approximately 40%, and the absorption of the red light emitted by the OLED through the black absorbing coating was greater than 99%. This embodiment also illustrates that one or more of the highly absorbing coating and the highly scattering coating can be applied to an additional substrate (in this case a glass slide) rather than directly onto the OLED.

EXAMPLE 3

A patterned, green-emitting OLED device was made in the following manner. Indium tin oxide (ITO) coated glass (15 ohm-square) was obtained from Applied Films Corporation, and portions of it were etched away using the vapors of aqua regia to provide the ITO pattern shown in FIG. 3. This substrate was then mechanically cleaned with a detergent, soaked in a methanol solution followed by a boiling isopropyl alcohol solution, and finally placed in an ozone cleaner for 5 minutes. An approximately 30 nm layer of poly(3,4)ethylenedioxythiophene/polystyrenesulphonate (PEDT/PSS) from Bayer Corporation was then spin coated onto the ITO. Approximately 70 nm of a green-emitting polymer (Green-B purchased from Dow Chemical Co.) was then spin coated onto the PEDT/PSS layer using xylene as the solvent. Next, a cathode consisting of an approximately 0.8 nm layer of lithium fluoride followed by about 200 nm of aluminum was evaporated onto the device through a shadow-mask to define the cathode pattern shown in FIG. 6. The cathode deposition was carried out in a glove box. After deposition of the cathode, a glass slide was attached to the cathode side of the device with epoxy in order to provide encapsulation. The resulting device consists of two independently addressable OLEDs which emit green light in a rectangular pattern.

Figure 8:
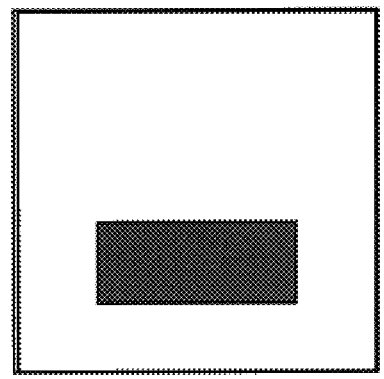
FIG. 8 is a sign in the form of a green rectangle in a white background.

A sign illustrating this invention was then made with this patterned OLED in the following manner. A highly scattering green coating (Testor's Spray Enamel #1601 Transparent Candy Emerald Green) with a green color similar to that of the OLED emission color was sprayed onto a thin transparent plastic film (3M Transparency Film PP2200). The area of the film covered by the green coating was chosen to match the emissive area of one of the OLED devices when the film is overlayed onto the emitting surface of the OLED device. Around this green region of the slide, a thick layer of a highly scattering coating consisting of a white paint (Acrylic Enamel Industrial Tough Coat from Krylon—a division of Sherwin-Williams Company) was sprayed around the rectangle as illustrated in FIG. 8. The transparent plastic film was then overlayed onto the emissive side of the OLED device to complete the sign in the form of a rectangle. In bright daylight, the sign is clearly visible as a green rectangle against a white background. Under low ambient light conditions, the sign can be activated by applying a voltage across the device. For this particular device, when a voltage is applied, the rectangle lights up with a green color against a white background. With a voltage of 4.5V, a luminance of about 1200 Cd/m$^2$ was measured. At this brightness level, the green sign is easily seen in a well-lit indoor environment or outdoors on an overcast day. For this particular example, the transmission for the green light emitted by the OLED through the green coating was measured to be approximately 40%, and the absorption of the green light emitted by the OLED through the white absorbing coating was measured to be about 90%. This example demonstrates that one or more of the highly absorbing coating and the highly scattering coating can be applied to an additional substrate (in this case a thin transparent plastic film) rather than directly onto the OLED. The example also shows that the a white paint can serve as the highly absorbing layer if it has a sufficient thickness (as in this EXAMPLE 3), or as the highly scattering layer if it is thin (as in EXAMPLE 1).

Additional embodiments of the invention involve various methods of implementing the outdoor display. The simplest method is to continuously provide power to the OLED day and night. This method may not be the most desirable mode of operation, because during the high ambient light conditions of daylight, the sign is read through reflected light rather than OLED light and hence power is wasted. An alternative method involves utilizing a timing circuit to power the OLED during a selected time interval (e.g., at night). This method is more desirable than the first, but is not effective during unexpected low ambient light conditions such as during an overcast day. A more desirable method involves controlling the powering of the OLED using a circuit which includes a photosensor or electric eye that can sense when low ambient light occurs and which provides power to the OLED at these times. The circuit can be designed to provide a fixed voltage to the OLED when the ambient light drops below a pre-set threshold value, or the circuit can modify the voltage applied to the OLED continuously in response to the ambient lighting conditions.

While the foregoing description includes many details, it is to be understood that these have been included for purposes of explanation only, and are not to be interpreted as limitations of the present invention. Many modifications to the embodiments described above can be made without departing from the spirit and scope of the invention, as is intended to be encompassed by the following claims.

What is claimed is:

1. A display device comprising:
    an organic light emitting device comprising an organic light emitting layer disposed between two electrodes, whereby said organic light emitting layer luminesces when electricity flows between said electrodes;
    a highly absorbing coating on a first region of the organic light emitting device; and
    a highly scattering coating on a second region of the organic light emitting device;
    wherein the first region and the second region are distinct and non-overlapping.

2. The display device of claim 1, wherein the organic light emitting layer comprises a plurality of organic layers.

3. The display device of claim 1, wherein the highly scattering coating comprises particles having an index of refraction greater than 1.4.

4. The display device of claim 3, wherein the particles comprise $TiO_2$, $ZnO$, and/or $SiO_2$.

5. The display device of claim 1, wherein the highly scattering coating comprises a pigment.

6. The display device of claim 5, wherein the pigment comprises a fluorescent material.

7. The display device of claim 1, wherein the first and second regions form a random pattern on the organic light emitting device.

8. The display device of claim 1, wherein at least one of the electrodes is substantially transparent.

9. The display device of claim 1, further comprising a substrate between the highly scattering coating and one of the two electrodes.

10. The display device of claim 9, wherein the electrode and the substrate are both substantially transparent.

11. The display device of claim 1, wherein at least one of the highly scattering coating and the highly absorbing coating comprises paint.

12. The display device of claim 1, wherein said highly absorbing coating comprises an opaque material.

13. The display device of claim 1, wherein at least one of the highly scattering coating and the highly absorbing coating is applied to a substrate, and the substrate is laminated onto the organic light emitting device.

14. The display device of claim 1, wherein said highly absorbing coating comprises paper, plastic, or metal.

15. The display device of claim 1, wherein at least one of the electrodes is patterned.

16. The display device of claim 15, in the form of a street sign.

17. The display device of claim 16, wherein the luminance of the display device is between about 30 $Cd/m^2$ and 10,000 $Cd/m^2$.

18. The display device of claim 17, wherein the voltage applied between the electrodes is between 2 volts and 20 volts.

19. The display device of claim 11, wherein the highly scattering coating changes the observed color of the organic light emitting layer.

20. The display device of claim 19, wherein the highly absorbing coating is at least one of colored, fluorescent and scattering.

21. The display device of claim 19, wherein said highly scattering coating comprises a fluorescent material.

22. A method for making a display device comprising the steps of:
    coating a first electrode layer with an organic light emitting layer;
    coating the organic light emitting layer with a second electrode layer;
    applying a highly scattering coating and a highly absorbing coating above the organic light emitting layer, corresponding to a pattern to be displayed;
    wherein the highly absorbing coating and the highly scattering coating are present in distinct and non-overlapping regions and are disposed above the organic light emitting layer.

23. The method of claim 22, wherein at least one of said electrode layers forms a pattern corresponding to the pattern to be displayed.

24. The method of claim 22, comprising applying the highly scattering coating and the highly absorbing coating to form a randomly displayed pattern.

25. The method of claim 22, wherein at least one of said electrodes is transparent or substantially transparent.

26. The method of claim 23, further comprising applying the highly scattering coating in a pattern corresponding to the pattern formed by at least one of said electrode layers.

27. The method of claim 23, wherein the first electrode layer forms a pattern and the second electrode layer is substantially transparent.

28. The method of claim 22, wherein the highly scattering layer comprises particles having an index of refraction greater than 1.4.

29. The method of claim 28, wherein said particles comprise $TiO_2$, $ZnO$, and/or $SiO_2$.

30. The method of claim 22, wherein the highly scattering coating comprises a pigment.

31. The method of claim 30, wherein the pigment comprises a fluorescent material.

32. The method of claim 22, wherein the highly scattering coating, the highly absorbing coating, or both comprise paint.

33. The method of claim 22, wherein the highly scattering coating or the highly absorbing coating, or both comprise paper, plastic, or metal.

34. The method of claim 22, wherein the luminance of the display device is between about 30 $Cd/m^2$ and 10,000 $Cd/m^2$.

35. The method of claim 22, wherein the voltage applied between the electrodes is between 2 volts and 20 volts.

36. The method of claim 22, wherein the highly scattering coating changes the observed color of the organic light emitting layer.

37. The method of claim 22, comprising coating the first electrode layer with a plurality of organic layers.

38. The method of claim 22, further comprising the step of adding a substrate layer between the highly scattering coating and said electrode.

39. The method of claim 38, wherein both said substrate and said electrode are transparent or substantially transparent.

40. A method for displaying a pattern visible in both light and dark comprising the step of applying electricity between said electrodes of the device of claim 1 when it is dark, and not applying electricity between said electrodes when it is light.

41. The method of claim 40, wherein the step of applying electricity is controlled with an electric eye which applies electricity between the electrodes dependent on the level of light.

42. The device of claim 1, further comprising a device which controllably applies electricity between said electrodes depending on the amount of light.

* * * * *